(12) United States Patent
Ottaviani et al.

(10) Patent No.: US 7,524,736 B2
(45) Date of Patent: Apr. 28, 2009

(54) PROCESS FOR MANUFACTURING WAFERS USABLE IN THE SEMICONDUCTOR INDUSTRY

(75) Inventors: Giampiero Ottaviani, Modena (IT); Federico Corni, Modena (IT); Paolo Ferrari, Gallarate (IT); Flavio Francesco Villa, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 178 days.

(21) Appl. No.: 11/607,802

(22) Filed: Dec. 1, 2006

(65) Prior Publication Data

US 2007/0155183 A1 Jul. 5, 2007

(30) Foreign Application Priority Data

Dec. 14, 2005 (EP) .................................. 05425885

(51) Int. Cl.
*H01L 21/30* (2006.01)
*C03C 15/00* (2006.01)
(52) U.S. Cl. .................... 438/455; 438/458; 216/35
(58) Field of Classification Search ................ 438/455, 438/458; 216/35
See application file for complete search history.

(56) References Cited

U.S. PATENT DOCUMENTS

| | | | |
|---|---|---|---|
| 5,374,564 A | 12/1994 | Bruel | |
| 6,013,567 A | 1/2000 | Henley et al. | |
| 6,346,458 B1 | 2/2002 | Bower | |
| 6,387,829 B1 | 5/2002 | Usenko et al. | |
| 6,696,352 B1 | 2/2004 | Carr et al. | |
| 7,320,929 B2* | 1/2008 | Aga et al. | 438/458 |
| 2004/0115899 A1 | 6/2004 | Bower | |
| 2004/0171196 A1 | 9/2004 | Walitzki | |
| 2004/0219370 A1* | 11/2004 | Aga et al. | 428/446 |
| 2005/0042840 A1* | 2/2005 | Aga et al. | 438/458 |

FOREIGN PATENT DOCUMENTS

WO WO 2004/004497 A1 5/2004

OTHER PUBLICATIONS

European Search Report from corresponding European Application No. 05425885.0, filed Dec. 14, 2005.

* cited by examiner

*Primary Examiner*—Shamim Ahmed
(74) *Attorney, Agent, or Firm*—Lisa K. Jorgenson; James H. Morris; Wolf, Greenfield & Sacks, P.C.

(57) ABSTRACT

To manufacture a layer of semiconductor material, a first wafer of semiconductor material is subjected to implantation to form a defect layer at a distance from a first face; the first wafer is bonded to a second wafer, by putting an insulating layer present on the second wafer in contact with the first face of the first wafer. Then, hydrogen atoms are introduced into the first wafer through a second face at an energy such as to avoid defects to be generated in the first wafer and at a temperature lower than 600° C. Thereby, the first wafer splits into a usable layer, bonded to the second wafer, and a remaining layer disposed between the defect layer and the second face of the first wafer. Prior to bonding, the first wafer is subjected to processing steps for obtaining integrated components.

30 Claims, 3 Drawing Sheets

PROCESS FOR MANUFACTURING WAFERS USABLE IN THE SEMICONDUCTOR INDUSTRY

BACKGROUND OF THE INVENTION

1. Field on the Invention

The present invention relates to a process for manufacturing high-quality wafers, both with and without devices, that can be used in the semiconductor industry. In particular, the present invention relates to a technique for manufacturing wafers having at least one thin layer of semiconductor material, typically silicon, obtained by detachment or separation of a bulk portion due to the introduction of an exfoliating agent in a starting substrate having a thickness greater than the desired one.

2. Discussion of the Related Art

This detachment technique enables so-called silicon-on-insulator (SOI) substrates to be obtained and is described in numerous documents.

For example, U.S. Pat. No. 5,374,564 to Bruel describes a process comprising implanting hydrogen ions on the front side of a silicon wafer; bonding the implanted silicon wafer to a support wafer having a surface oxide layer, so that the surface oxide layer bonds to the front side of the silicon wafer; and annealing at a temperature higher than 500° C. In this way, the implantation of hydrogen ions causes a layer of gas microbubbles to form within the silicon wafer at a depth equal to the mean penetration depth of the hydrogen. During the final thermal treatment, the microbubble layer determines the splitting between the overlying layer, which forms a thin silicon layer bonded to the support wafer, and the rest of the first wafer.

U.S. Pat. No. 6,013,567 to Henley and U.S. Pat. No. 6,387,829 to Usenko et al., describe processes like Bruel process referred to above. They differ only in the detachment technique. As indicated, Bruel uses a thermal treatment, Henley uses a jet of a pressurized fluid aimed against the edge of the wafer, and Usenko et al. use different sources of energy, such as ultrasound, hydrostatic pressure, hydrodynamic pressure, infrared light, or mechanical force.

The main disadvantage of the described known processes lies in the high dose of implanted hydrogen atoms, of the order of $10^{16}$-$10^{17}$ atoms/cm$^2$, necessary for creating the microbubble layer. In fact, the hydrogen distributes approximately as a Gaussian, the extension whereof is determined by the longitudinal distribution of the process of ion-silicon interaction. Outside the peak region, the dose is sufficiently high to induce the formation of small bubbles and of defects <111> in the monocrystalline silicon. Consequently, the thin silicon layer overlying the implanted layer is defective, and thus leads to the formation of a SOI substrate of poorer quality than the monocrystalline silicon currently used.

To overcome this problem, the possibility of reducing the dose of hydrogen by a factor of 5-10 has been studied by implanting, in the same region, hydrogen and helium. Tests carried out have, however, highlighted that also this solution does not enable a thin layer completely devoid of defects to be obtained.

The possibility of introducing hydrogen via a plasma has also been explored. The hydrogen is gettered via a buried trap layer. The trap layer can be created by implanting and subsequent annealing a P type dopant, such as boron, acting as gettering material, see, for example, U.S. Pat. No. 6,346,458 to Bower.

Tests have demonstrated, however, that the use of a plasma with high-energy particles produces defects on the surface of the specimen, and hence it is not possible to obtain the quality necessary for integration of components.

Finally, U.S. Pat. No. 6,696,352 B1 to Carr et al. describes a process comprising implanting silicon ions (at least $10^{13}$ atoms/cm$^2$) in a first wafer so as to form a trap layer formed by defects localized principally at the ion end-of-range; application, on a different wafer, of an adhesive layer capable of releasing hydrogen ions after polymerization; bonding the two wafers; polymerizing the adhesive layer so as to obtain release and diffusion of the hydrogen atoms in the first wafer; gettering the hydrogen atoms at the trap layer; forming microbubbles; and detaching a portion of the first wafer.

It is to be noted that in the foregoing sequence, as hereinafter, the term "ion end-of-range (EOR)" indicates a region of the specimen, parallel to its surface, where the implanted ions are localized. This region also houses an accumulation of silicon interstitials that create EOR defects. The distance of this region from the surface of the specimen depends upon the type of ion, its energy, and the target. For a same energy, light ions (e.g., B) have a greater EOR than heavy ions (e.g., As), while, for the same ions, the increase of energy causes an increase in the distance between the EOR and the surface.

Also this process suffers from the above problems, due to the hydrogen atoms crossing the thin layer of the first wafer and to the interaction of the hydrogen with the defects created by the silicon ions throughout the layer.

The aim of the invention is thus to provide a process for manufacturing a thin high-quality layer of semiconductor material, such as silicon, so as to enable integration of electronic components.

SUMMARY OF THE INVENTION

According to the present invention, a process for manufacturing wafers usable in the semiconductor industry is provided, comprising, in sequence providing a first wafer of semiconductor material having a first face and a second face; forming a defect layer in said first wafer at a distance from said first face; bonding said first face of said first wafer to a second wafer; and introducing atomic hydrogen into said first wafer through said second face at an energy such as to avoid defects to be generated in said first wafer and at a temperature lower than 600° C., causing the separation of said first wafer into a usable layer bonded to said second wafer and a remaining layer comprised between said defect layer (6) and said second face.

In practice, the invention exploits the efficiency of defects of the crystalline structure of a semiconductor material such as silicon in gettering hydrogen atoms, the capacity of the hydrogen atoms to diffuse in monocrystalline semiconductor material, such as silicon, and the capacity of hydrogen to diffuse at low thermal energies such as to avoid defects to be generated; thereby preventing trapping of the hydrogen atoms in self-generated defects; and the capacity of the hydrogen atoms to diffuse through large thickness so as to enable introduction thereof from the back of the wafer and thus prevent damage of the useful part of the wafer by the introduction step.

BRIEF DESCRIPTION OF THE DRAWINGS

For an understanding of the present invention, preferred embodiments are now described, purely by way of non-limiting example, with reference to the attached drawings, wherein.

DETAILED DESCRIPTION

According to one aspect of the invention, a first wafer is subjected to ion implantation and annealing so as to create a buried layer acting as trap for hydrogen and thus remove the radiation caused damage between the surface and the ion EOR. The first wafer is then treated so as to obtain electronic components and is subsequently bonded to a suitable substrate. A thermal treatment is then performed so as to enable hydrogen diffusion from the back of the wafer towards the implanted buried layer. The hydrogen is in the atomic form and has low energy, or in any case lower than values that produce defects on the rear surface of the wafer. The wafer splits at the implanted buried layer.

Thereby, the thin layer of semiconductor material bonded to the support has a high quality, since it has not been either bombarded or traversed by hydrogen atoms. Furthermore, the process comprises simple steps commonly used in the semiconductor industry and hence, with respect to the similar known processes, is reliable, repeatable and economically advantageous.

Figure 1:
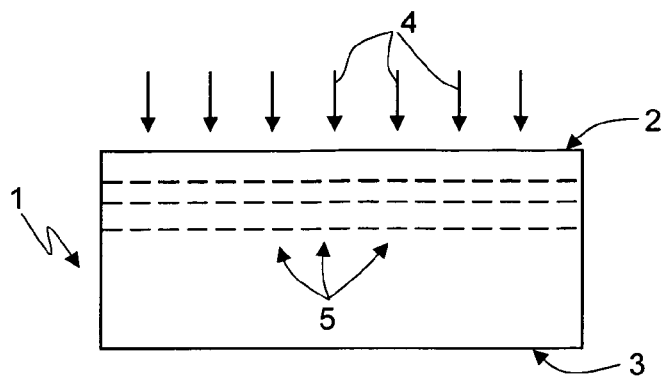
FIGS. 1-6 show a substrate of semiconductor material in successive manufacturing steps, according to a first embodiment of the invention.

A first embodiment of the invention is described hereinafter. Initially (FIG. 1), a first wafer 1 of monocrystalline silicon having a first face 2 and a second face 3, is implanted with one or more dopant species capable of generating defects within the first wafer 1, as represented schematically in the figure by the arrows 4 and by the generated defects 5. In general, the implanted chemical species is of no importance; for example, various types of ions, such as Si, Ge, Ne, Ar, As and P can be used. The implantation dose can range between $10^{13}$ and $10^{16}$ atoms/cm$^2$, and preferably is of the order of $10^{15}$ atoms/cm$^2$, and the implantation energy is, for example, 10-300 keV. The implantation occurs through the first face 2 (so-called wafer front 1) and produces defects of various kinds: extensive defects, point defects, agglomerations of defects.

Then a rapid thermal process is performed at a high temperature to remove the majority of the damage and to obtain just one defect layer (designated schematically in the figures by 6), so-called EOR or End Of Range damage. For example, a rapid thermal process (RTP) is performed at temperatures of between 1200° C. and 800° C., preferably between 1100° C. and 700° C., more preferably at about 900° C. The defect layer 6 thus obtained extends in a plane parallel to the first face 2 of the first wafer 1, at a distance therefrom depending upon the implanted chemical species and the process conditions.

Figure 3:
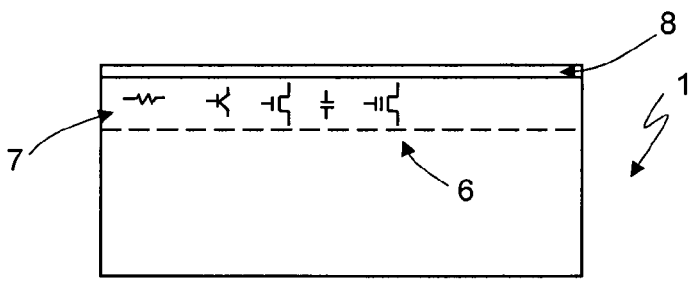

Then (FIG. 3), electronic components are integrated in and on top of the layer comprised between the defect layer 6 and surface 4, using the known techniques for manufacturing semiconductor devices. The figure shows schematically some components 7, which can be integrated, and a passivation layer 8 (for example, a silicon-oxide layer), which covers the first surface 4 and accommodates the electrical connections between the components 7.

Figure 4:
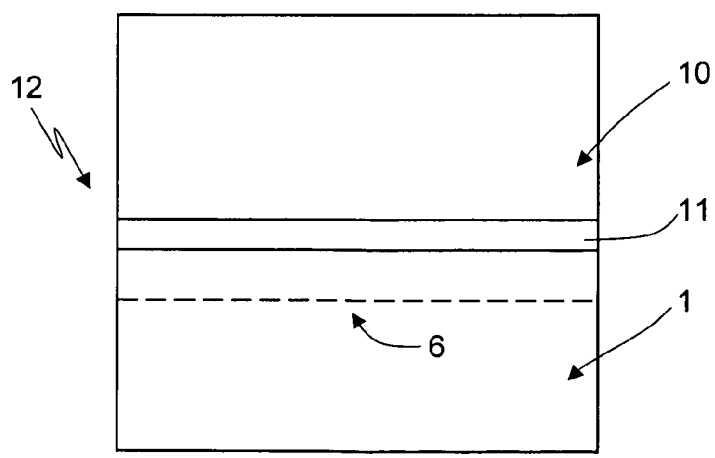

Next (FIG. 4), the first wafer 1 is bonded to a second wafer 10, one face whereof is coated with an insulating layer 11, typically a silicon-oxide layer. The second wafer 10 can also be formed by monocrystalline silicon; alternatively, it may be glass or flexible material. Bonding is performed in a known way, by putting the passivation layer 8 and the insulating layer 11 in contact under pressure at an appropriate temperature, and can be stabilized via annealing at a maximum temperature of 600° C., preferably comprised between 200° C. and 400° C., and in any case such as not to damage the electronic components 7 integrated in the first wafer 1. Then a multilayer wafer 12 is obtained, formed by the first wafer 1, by the insulating layer 11 (which includes the passivation layer 8, not illustrated) and by the second wafer 10.

Figure 5:
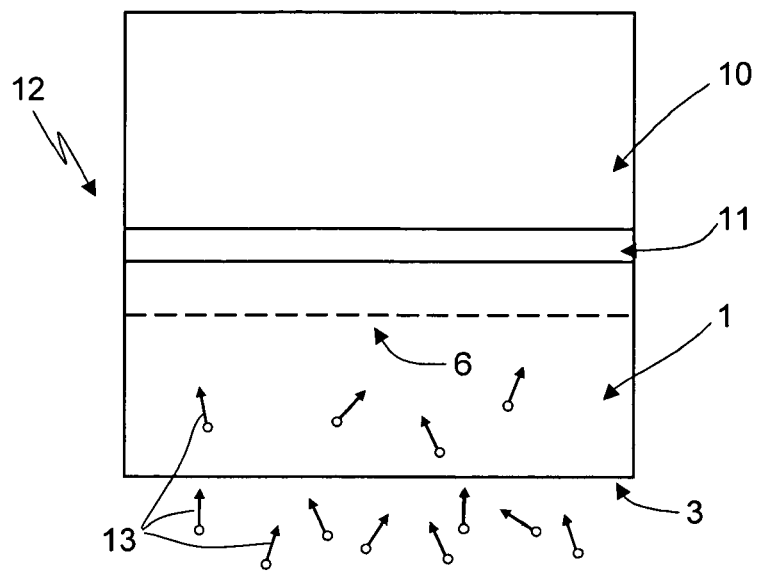

Then, the multilayer wafer 12 is exposed to a flow of atomic hydrogen at thermal energies such as to prevent breakage of the Si—Si bonds; in particular, thermal hydrogen is used at an energy lower than 50 eV, preferably less than 10 eV. This step is illustrated schematically in FIG. 5 where the hydrogen atoms are designated by 13. Exposure occurs at a temperature not higher than 600° C., preferably lower than 500° C., more preferably 200° C.-400° C.

Figure 6:
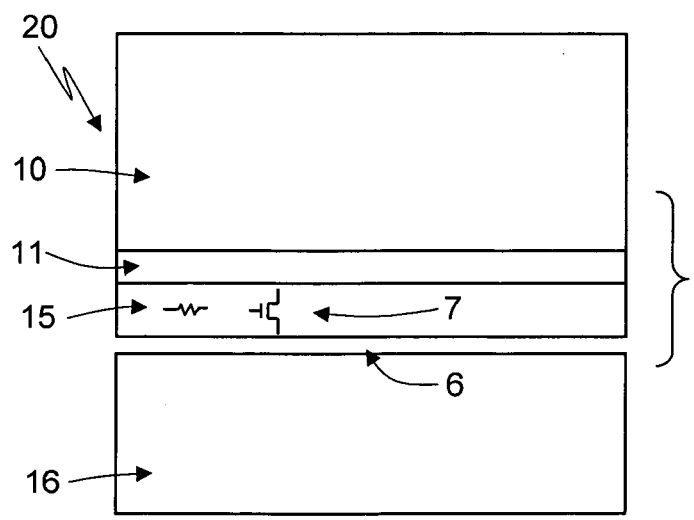

By virtue of the exposure in the indicated conditions of temperature and energy, one obtains, amongst other things, diffusion of the hydrogen atoms 13 within the first wafer 1 through the second face 3. The hydrogen atoms 13 thus reach the defect layer 6 and accumulate along this layer, giving rise to an exfoliation, so that the first wafer 1 splits to yield a thin layer 15 of monocrystalline silicon, bonded to the insulating layer 11, and a bulk portion 16, as illustrated in FIG. 6. The bulk portion 16 can possibly then be re-used.

The ensemble made up of the thin layer 15, the insulating layer 11, and the second wafer 10 thus forms a SOI wafer 20, which can be used directly, after the final operations to form passivations, contacts, connections, etc., and cutting into chips.

Figure 2:
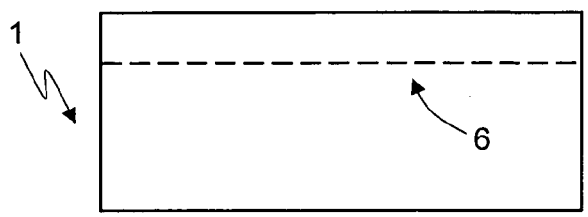
Figure 7:
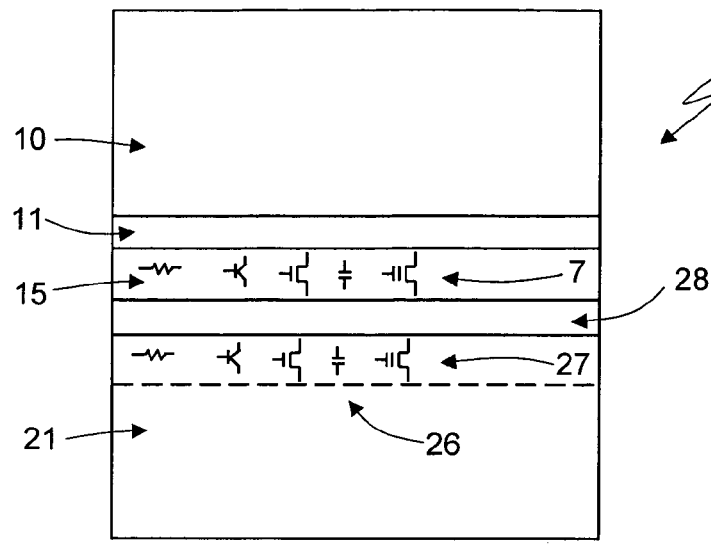
FIGS. 7 and 8 show a substrate in two different manufacturing steps according to a different embodiment.
Figure 8:
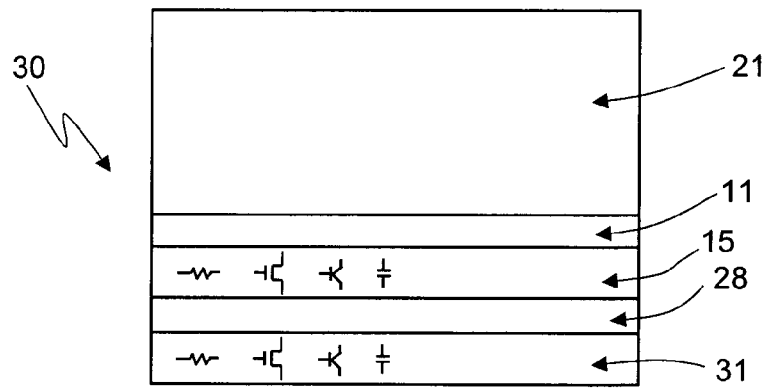

Alternatively, as illustrated in FIG. 7, the SOI wafer 20 can be used as a support for a third wafer 21, pre-treated as described previously with reference to FIGS. 1-3, and hence already implanted and subjected to annealing so as to generate a second defect layer 26, and already subjected to the steps of manufacturing integrated components 27. In this case, a second insulating layer 28 is provided on the free surface of the thin layer 15. After bonding the SOI wafer 20 to the third wafer 21, a composite wafer 29 is obtained, which can be exposed to atomic hydrogen to obtain exfoliation and detachment of the bottom portion of the third wafer 21, giving rise to the final wafer 30 illustrated in FIG. 8, where the layer 31 represents the remaining portion of the third wafer 21.

The process described can be repeated a number of times, giving rise to a three-dimensional circuit structure.

Figure 9:
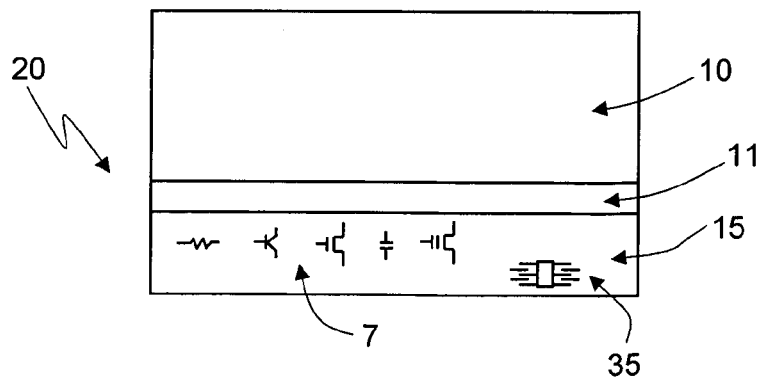
FIG. 9 shows another embodiment of the invention.

FIG. 9 shows a variant according to which, at the end of detachment of the sacrificial portion 15 of the first wafer 1, at the end of the operations illustrated in FIG. 6, the thin layer 15 is subjected to further processing steps for obtaining components, such as, for example, micro-electromechanical-system (MEMS) components, as represented schematically in FIG. 9 and designated by the reference number 35. In particular, MEMS components of any type can be formed, which do not require fabrication steps incompatible with the integrated components 7 that have already been formed.

Thereby, it is possible to obtain a monocrystalline layer of better quality than the ones obtainable with the separation technique, as well as at comparable or even lower costs. The thickness of the monocrystalline layer can be chosen on the basis of the envisaged application, by modifying the implantation conditions (chemical species, energy, and temperature).

The process enables structures to be obtained at different heights, isolated from one another and/or connected by m appropriate connection lines traversing the insulating layers.

Finally, it is clear that numerous modifications and variations may be made to the manufacturing process described and illustrated herein, all falling within the scope of the invention, as defined in the annexed claims. For example, the insulating layer 11 that enables bonding between the first and the second wafer can be provided on the first wafer 1, if the thermal conditions so enable, or even be formed by the passivation layer 8.

Possibly, in addition to the hydrogen atoms, also other reactive atoms may be diffused, such as for example fluorine.

The invention claimed is:

1. A process for manufacturing a layer of semiconductor material, comprising, in sequence:
   providing a first wafer of semiconductor material having a first face and a second face;
   forming a defect layer in said first wafer at a distance from said first face;
   bonding said first face of said first wafer to a second wafer; and
   introducing atomic hydrogen into said first wafer through said second face at an energy such as to avoid defects to be generated in said first wafer and at a temperature lower than 600° C., causing the separation of said first wafer into a usable layer bonded to said second wafer and a remaining layer comprised between said defect layer and said second face.

2. The process according to claim 1, wherein, prior to said bonding, providing electronic components integrated in and on top of said first wafer in proximity of said first face.

3. The process according to claim 1, wherein said forming a defect layer comprises implanting ion species such as to generate defects within said first wafer and carrying out a first thermal process.

4. The process according to claim 3, wherein said ion species are chosen in the group comprising Si, Ge, Ne, Ar, As, and P.

5. The process according to claim 3, wherein said implanting is carried out at a dose comprised between $10^{13}$ and $10^{16}$ atoms/cm$^2$, preferably between 1 and 15 atoms/cm$^2$.

6. The process according to claim 3, wherein said first thermal process comprises carrying out a rapid thermal process at temperatures comprised between 1200° C. and 800° C., preferably between 1100° C. and 700° C.

7. The process according to claim 1, wherein said bonding comprises forming an insulating layer on one of said first and second wafers and putting said first wafer in contact with second wafer through said insulating layer.

8. The process according to claim 7, wherein, after the bonding, a second stabilization annealing is carried out at a temperature of between 200° C. and 600° C., typically between 200° C. and 400° C.

9. The process according to claim 1, wherein said atomic hydrogen has an energy lower than 50 eV, preferably lower than 10 eV.

10. The process according to claim 1, wherein introducing atomic hydrogen is carried out at a temperature lower than 500° C., preferably comprised between 300° C. and 400° C.

11. The process according to claim 1, further comprising:
    providing a third wafer of semiconductor material having a first face and a second face;
    forming a defect layer in said third wafer, at a distance from said first face thereof;
    bonding said first face of said third wafer to said usable layer; and
    introducing atomic hydrogen into said third wafer through said second face of said third wafer at an energy such as to avoid defects to be generated in said third wafer and at a temperature lower than 600° C., causing separation of said third wafer into an active layer bonded to said usable layer and a discard layer.

12. The process according to claim 1, further comprising providing MEMS components in said usable layer.

13. A process for manufacturing wafers, comprising:
    implanting one or more dopant species in a wafer;
    performing a thermal process to remove at least some defects in the wafer, forming a defect-reduced region demarcated from a bulk region by a defect boundary; and
    introducing hydrogen atoms through the bulk region, wherein the defect boundary prevents at least some of the hydrogen atoms from entering the defect-reduced region.

14. The process of claim 13, wherein the defect boundary prevents a majority of the hydrogen atoms from entering the defect-reduced region.

15. The process of claim 13, further comprising integrating electronic components in or on top of the defect-reduced region.

16. The process of claim 13, wherein a sufficient amount of the hydrogen atoms accumulate along the defect boundary, causing the defect-reduced region to separate from the bulk region at the defect boundary.

17. The process of claim 16, wherein the hydrogen atoms have an energy level that enables the sufficient amount of the hydrogen atoms to reach the defect boundary without being trapped by defects at one or more locations other than the defect boundary.

18. The process of claim 16, wherein the hydrogen atoms are introduced at an energy level that is at most 50 eV.

19. The process of claim 16, wherein the hydrogen atoms are introduced at an energy level that is at most 10 eV.

20. The process of claim 13, wherein the one or more dopant species are selected from a group of elements comprising group 14, group 15, and group 18.

21. The process of claim 13, wherein the one or more dopant species comprise one of more of Si, Ge, Ne, Ar, As, and P.

22. The process of claim 13, wherein the defect-reduced region is a first defect-reduced region, and wherein the process further comprises:
    implanting one or more second dopant species in a second wafer;
    performing a second thermal process to remove at least some second defects in the second wafer, forming a second defect-reduced region demarcated from a second bulk region by a second defect boundary;
    bonding the first and second defect-reduced regions; and
    introducing hydrogen atoms through the second bulk region, causing the second defect-reduced region to separate from the second bulk region at the second defect boundary.

23. A process for manufacturing a layer of semiconductor material, comprising:
    forming a defect boundary within a first wafer, wherein the defect boundary demarcates a usable region of the first wafer from a bulk region of the first wafer;
    bonding the usable region to a second wafer; and
    introducing hydrogen atoms through the bulk region, wherein the defect boundary prevents at least some of the hydrogen atoms from entering the usable region.

24. The process of claim 23, wherein the defect boundary prevents a majority of the hydrogen atoms from entering the usable region.

25. The process of claim 23, wherein the defect boundary is formed, at least partially, by:
    implanting one or more dopant species in the first wafer, the one or more dopant species comprising one of more of Si, Ge, Ne, Ar, As, and P; and performing a thermal process to remove at least some defects in the first wafer.

26. The process of claim 25, wherein the thermal process is a rapid thermal process performed at temperatures between 700° C. and 1100° C.

27. The process of claim 23, further comprising, before bonding the usable region to the second wafer:
  integrating electronic components in or on top of the usable region; and
  covering a surface of the usable region with a passivation layer.

28. The process of claim 27, wherein the passivation layer comprises a silicon-oxide layer.

29. The process of claim 23, wherein the hydrogen atoms are introduced at an energy level that is at most 50 eV.

30. The process of claim 23, wherein the hydrogen atoms are introduced at an energy level that is at most 10 eV.

* * * * *

UNITED STATES PATENT AND TRADEMARK OFFICE
CERTIFICATE OF CORRECTION

PATENT NO. : 7,524,736 B2
APPLICATION NO. : 11/607802
DATED : April 28, 2009
INVENTOR(S) : Giampiero Ottaviani et al.

It is certified that error appears in the above-identified patent and that said Letters Patent is hereby corrected as shown below:

Col. 2, line 54, should read:
atoms to diffuse through large thicknesses so as to enable intro- Signed and Sealed this Twenty-third Day of June, 2009

JOHN DOLL
*Acting Director of the United States Patent and Trademark Office*